(12) United States Patent
Morse et al.

(10) Patent No.: US 6,605,959 B1
(45) Date of Patent: Aug. 12, 2003

(54) STRUCTURE AND METHOD FOR IMPLEMENTING WIDE MULTIPLEXERS

(75) Inventors: Douglas C. Morse, Yamhill, OR (US); Clement Lee, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/017,859

(22) Filed: Dec. 14, 2001

(51) Int. Cl.[7] .............................................. H03K 19/177
(52) U.S. Cl. .............................. 326/38; 326/39; 326/40; 326/41
(58) Field of Search ...................... 326/38–41

(56) References Cited

U.S. PATENT DOCUMENTS 5,371,422 A * 12/1994 Patel et al. .................... 326/41
5,701,091 A * 12/1997 Kean ............................. 326/41
5,742,180 A * 4/1998 DeHon et al. ................. 326/40

\* cited by examiner

*Primary Examiner*—Michael Tokar
*Assistant Examiner*—Vibol Tan
(74) *Attorney, Agent, or Firm*—MacPherson Kwok Chen & Heid LLP

(57) ABSTRACT

A method and a structure provide in a programmable logic device wide multiplexers without increasing delay and the number of interconnections in an input routing resource over corresponding multiplexer with less number of input signals. In one embodiment, each of a number of 8-input multiplexers shares both common input signals and common selection signals with a neighboring multiplexer. Even wider multiplexers can be achieved by cascading the multiplexers in a conventional manner.

19 Claims, 5 Drawing Sheets

TABLE 1

| Mux Size Created | 4:1 | 8:1 | 16:1 | 32:1 | 64:1 |
|---|---|---|---|---|---|
| Conventional—Cascading 4:1 muxes | | | | | |
| Routing Inputs | 7 | 21 | 35 | 77 | 147 |
| Muxes Required | 1 mux | 3 muxes | 5 muxes | 11 muxes | 21 muxes |
| Delay | 1 level | 2 levels | 2 levels | 3 levels | 3 levels |
| Conventional—Cascading 8:1 muxes | | | | | |
| Routing Inputs | 12 | 12 | 36 | 60 | 108 |
| Muxes Required | 1 mux | 1 muxes | 3 muxes | 5 muxes | 9 muxes |
| Delay | 1 level | 1 level | 2 levels | 2 levels | 2 levels |
| Invention—Input Shared 8-input muxes | | | | | |
| Routing Inputs | 7 | 12 | 31 | 55 | 108 |
| Muxes Required | 1 mux | 1 muxes | 3 muxes | 5 muxes | 9 muxes |
| Delay | 1 level | 1 level | 2 levels | 2 levels | 2 levels |

FIG. 6

STRUCTURE AND METHOD FOR IMPLEMENTING WIDE MULTIPLEXERS

BACKGROUND OF THE INVENTION

1. Field of the Invention

The present invention relates to programmable logic devices (PLDs). In particular, the present invention relates to providing wide programmable multiplexers for routing signals in a PLD.

2. Discussion of the Related Art

FIGS. 1 and 2 illustrate, in conventional PLD 100, an implementation of a wide multiplexer using two or more multiplexers each having a lesser number of input signals than the wide multiplexer. FIG. 1 shows a portion of conventional PLD 100 providing multiplexers 101–104, as programmable resources or logic elements. In FIG. 1, each of multiplexers 101–104 receives four input signals from input routing resource 105. Input routing resource 105 includes programmable interconnections that feedback output signals at terminals 106–109 of multiplexers 101–104 as input signals to some of the input signals to multiplexers 101–104. Thus, as shown in FIG. 2, output signals at terminals 106 and 108 are programmed to be routed by input routing resource 105 as input signals to multiplexer 102. Thus, under this arrangement, an 8-input multiplexer is provided. The output signal at terminal 107 of multiplexer 102 is asserted after delays through multiplexers 101 or 103, whichever is greater, and 102.

Alternatively, wider multiplexers can be provided without incurring additional level of delay, as shown in FIG. 3. In FIG. 3, conventional PLD 300 provides 8-input multiplexers 301–304. However, to provide sufficient connectivity for routing the input signals to multiplexer 301–304, input routing resource 305 must be correspondingly enlarged. In one implementation, the number of required connections in input routing resource 305 is provided by $N^* (M_i + \log_2 M_i + F_b)$, where N is the number of multiplexers, $M_i$ is the number of input signals routed into each multiplexer, and $F_b$ is the number of multiplexer input signals that are routed by routing resource 305 from an output terminal of a multiplexer. As can be readily seen, in a configuration including one hundred such 8-input multiplexers, the number of connections in input routing resource 305 is 1200, which is a large increase in silicon area required in PLD 300 over corresponding 4-input multiplexers.

SUMMARY OF THE INVENTION

A method and a structure provide in a programmable logic device wide multiplexers without increasing delay and the number of interconnections required of an input routing resource associated with each multiplexer.

According to one embodiment of the present invention, a programmable logic circuit includes a number of multiplexers, with each of the multiplexers receiving a predetermined number of input signals, in which a second predetermined number of the input signals in each multiplexer are shared with a neighboring multiplexer. In that embodiment, a routing resource provides input signals to each multiplexer. The output signal of each multiplexer is routed in a feedback manner through the routing resource as input signals to the multiplexers.

According to another embodiment of the present invention, each multiplexer receives a predetermined number of selection signals, in which some of these selection signals in each multiplexer are shared with a neighboring multiplexer. The selection signals can also be received from the routing resource.

In one implementation, 50% of the input signals received at a multiplexer is common with a neighboring multiplexer. In one implementation, each multiplexer receives eight input signals.

The multiplexers of the present invention may be cascaded in a conventional manner to provide an even wider multiplexer.

The present invention is better understood upon consideration of the detailed description below, and the accompanying drawings.

BRIEF DESCRIPTION OF THE DRAWINGS

FIG. 6 shows Table 1, which compares the number of routed input signals, the numbers of multiplexers required, and the numbers of multiplexer level delays between implementations of multiplexers of various widths, using conventional 4:1 and 8:1 multiplexers and multiplexers 401–404 in the embodiment in PLD 400 of FIG. 4.

In this description, to facilitate cross-referencing among the figures, like elements are assigned like reference numerals.

DETAILED DESCRIPTION OF THE PREFERRED EMBODIMENTS

The present invention provides a structure and a method that provide wide multiplexers with short propagation delay and with a reduced number of additional interconnections required in the input routing resource over corresponding multiplexers with a lesser number of input signals.

Figure 4:
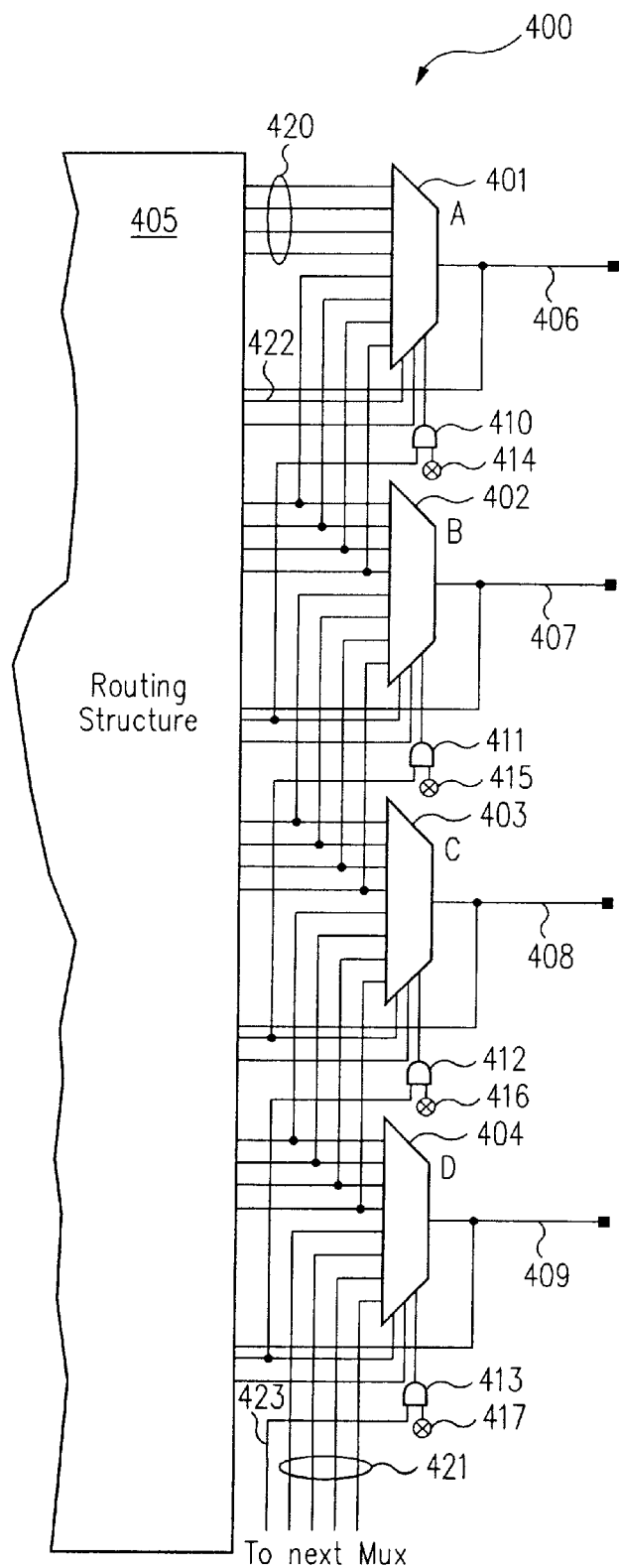
FIG. 4 shows, in PLD 400, 8-input multiplexers 401–404 providing output signals 405–409, in accordance with one embodiment of the present invention

FIG. 4 shows, in PLD 400, 8-input multiplexers 401–404 providing output signals 406–409, in accordance with one embodiment of the present invention. In PLD 400, each of multiplexers 401–404 shares 4 common input signals with a neighboring multiplexer. In addition, each of multiplexers 401–404 also shares a common selection signal with a neighboring multiplexer. In one embodiment, a "wrap around" configuration is provided by making multiplexers 401 and 404 neighboring each other. That is, routing resource 405 connects input terminals 420 of multiplexer 401 to input terminals 421 of multiplexer 404, and selection terminal 422 of multiplexer 401 to selection terminal 423 of multiplexer 404. (The input signals of a multiplexer are sometimes referred to as "data signals," and the terminals carrying the data signals are sometimes referred to as "data lines." Likewise, the selection signals of a multiplexer are sometimes referred to as "control signals," and the terminals carrying the control signals are sometimes referred to as "control lines.") Output signals 406–409 of multiplexers 401–405 are provided as feedback signals to be routed back by input routing resource 405 as input signals to multiplexers 401–404. Routing resource 405 can be implemented, for example, as a cross-point switch. Multiplexers 401–404 can be configured as 4-input multiplexers by setting fuses 414–417, which can be programmed to force a selection signal through AND gates 410–413 to configure multiplexers 401–404 as 4-input multiplexers.

Figure 1:
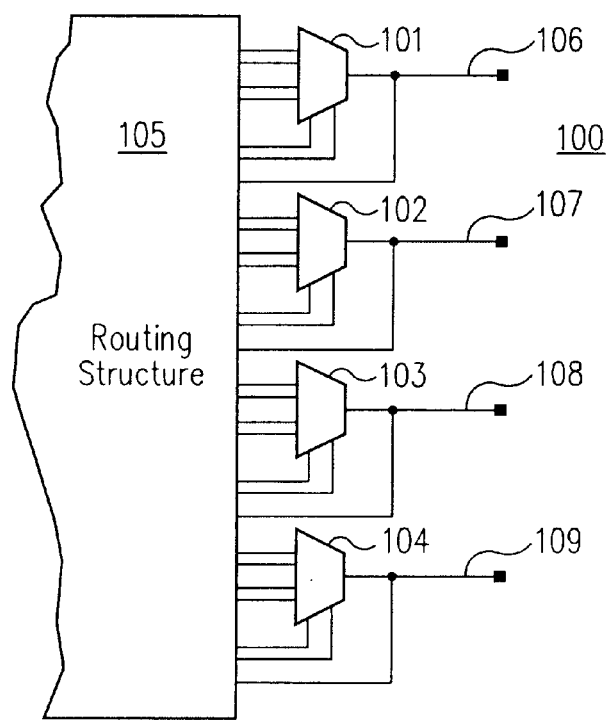
FIG. 1 shows multiplexers 101–104 provided as programmable resources or logic elements in conventional PLD 100.
Figure 2:
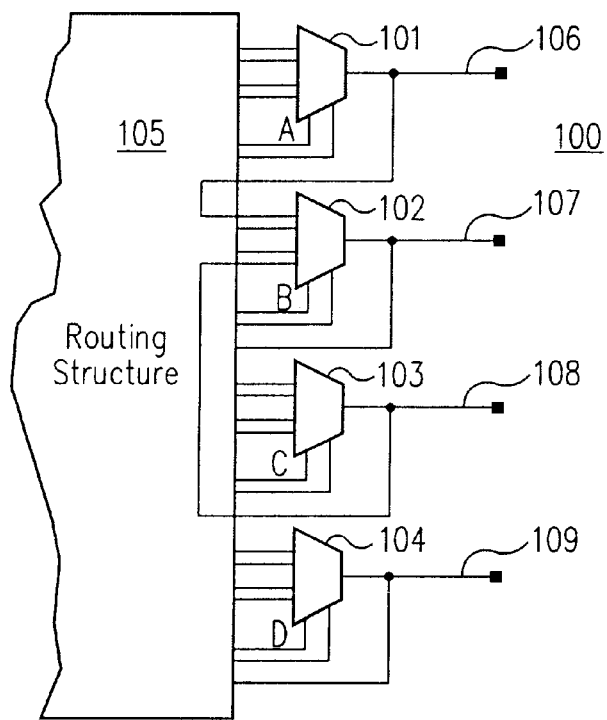
FIG. 2 illustrates, in conventional PLD of FIG. 1, implementation of a wide multiplexer using multiplexers 101–103, each receiving a lesser number of input signals.
Figure 3:
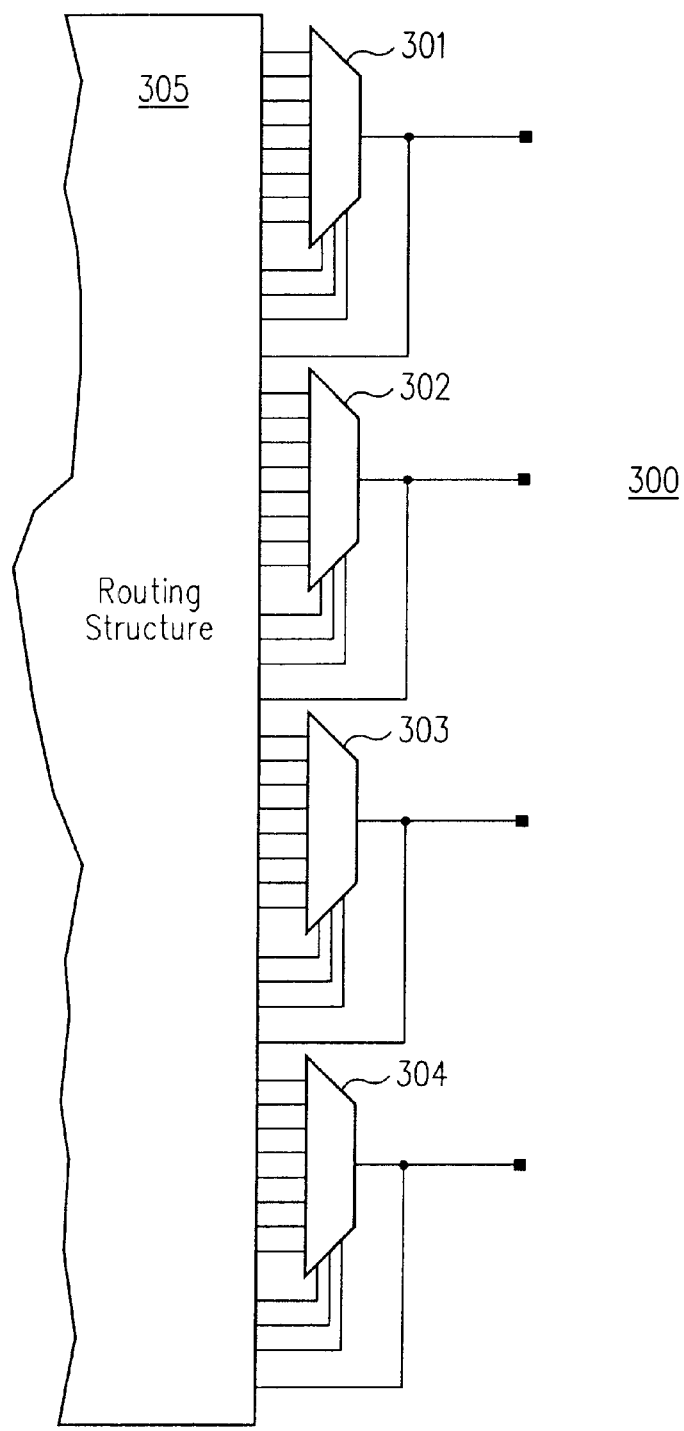
FIG. 3 shows 8-input multiplexers 301–304 provided as programmable resources or logic elements in conventional PLD 300.
Figure 5:
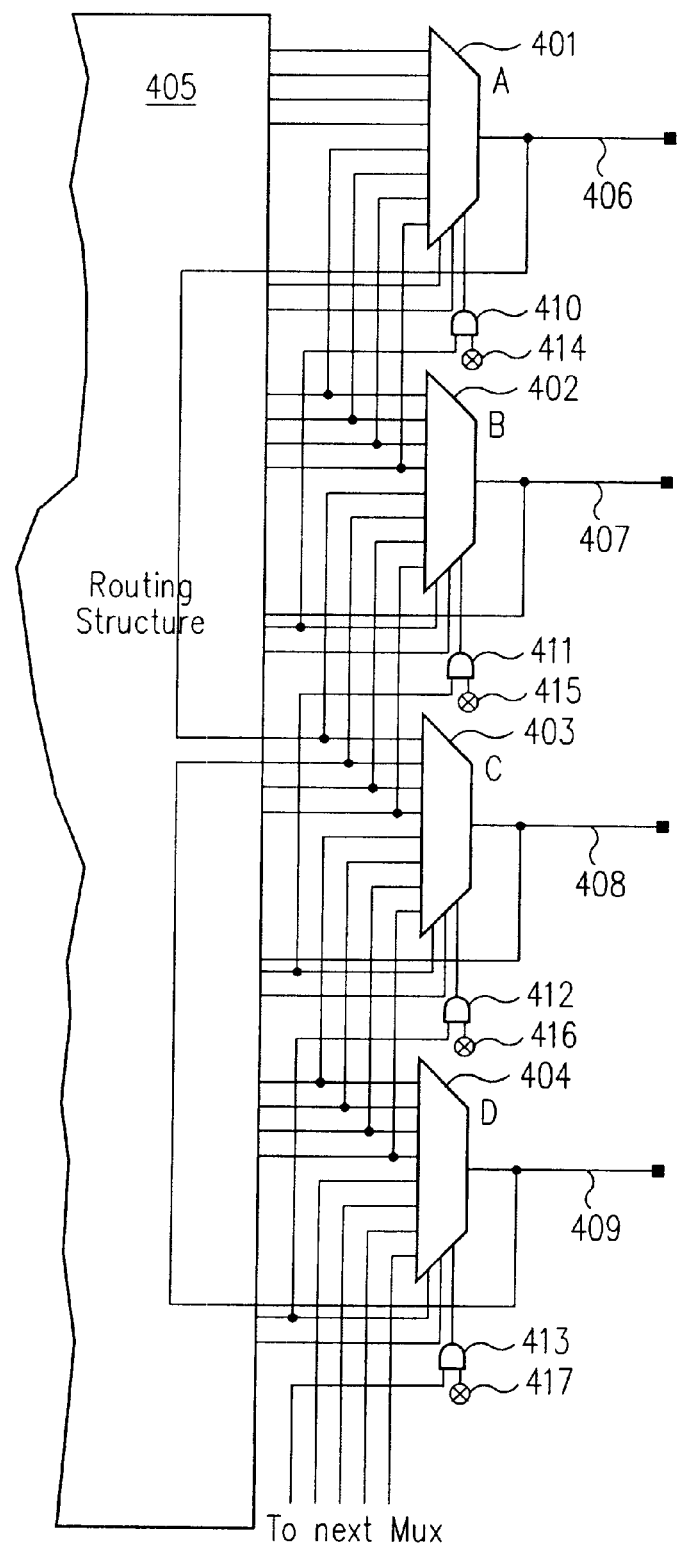
FIG. 5 shows cascading multiplexers 401–404 to provide a 16:4 multiplexer, incurring only a single multiplexer level delay.

In PLD 400, it can be seen that the total number of input signals and the number of feedback signals provided by input routing resource 405 to the four multiplexers are the same as the number of input signals and feedback signals provided by input routing resource 105 of FIG. 1. Because one of the selection signals in each multiplexer is shares with a neighboring multiplexer, the number of selection signal provided through routing resource 405 is also the same as the number of selection signal provided by routing resource 105 of FIG. 1. Thus, the number of interconnections required in routing resource 405 to support 8-input multiplexers 401–404 is not increased over routing resource 105 to support multiplexers 101–104. Further, output signal 406 of multiplexer 401, for example, incurs only one multiplexer signal delay. Of course, multiplexers 401–404 can be cascaded in the conventional fashion to create even wider multiplexers. For example, FIG. 5 shows cascading multiplexers 401–404 to provide a 16:1 multiplexer, incurring only a single additional multiplexer level delay.

Table 1 in FIG. 6 compares the number of routed input signals, the number of multiplexers required, and the numbers of multiplexer level delays for multiplexers of various widths, using conventional 4:1 and 8:1 multiplexers and multiplexers 401–404 in the embodiment in PLD 400 of FIG. 4.

The above detailed description is provided to illustrate the specific embodiments of the present invention, and is not intended to be limiting. Numerous variations and modifications within the scope of the present invention are possible. For example, the number of common shared input signals between neighboring multiplexers can be more or less, depending on the specific contemplated applications. The present invention is set forth in the following claims.

We claim:

1. A programmable logic circuit comprising:
   a first multiplexer configured to select from a first set of M input signals to provide an output signal;
   a second multiplexer configured to select from a second set of M input signals to provide an output signal, wherein N of the M input signals in the first and second set of input signals are the same, wherein each of the first and second multiplexers receives P selection signals, wherein Q of the P signals are received at both the first and second multiplexers; and
   a routing resource configured to receive the output signals from the first and second multiplexers and to select from these output signals and a routing set of input signals to provide the first and second set of M input signals.

2. The programmable logic circuit of claim 1, wherein the P selection signals are received from the routing resource.

3. The programmable logic circuit of claim 1, wherein M equals 2N.

4. The programmable logic circuit of claim 3, wherein M equals 8.

5. A method for providing multiplexers in a programmable logic circuit, the method comprising:
   providing a first multiplexer and a second multiplexer, each of the first and second multiplexers receiving M input signals, wherein N of the M input signals are received at both the first and second multiplexers;
   routing the set of M input signals to each of the first and second multiplexers through a routing resource;
   routing an output signal from each of the first and second multiplexers through the routing resource as input signals to the first and second multiplexers; and
   providing each of the first and second multiplexers P selection signals, wherein Q of the P signals are received at both the first and second multiplexers.

6. The method of claim 5, further comprising:
   routing the P selection signals from the routing resource.

7. The method of claim 5, wherein M equals 2N.

8. The method of claim 7, wherein M equals 8.

9. A programmable logic device comprising:
   a routing resource having a first set of routing input lines and a second set of routing input lines, each routing input set including at least two data lines and one or more control lines;
   a first multiplexer having input terminals coupled to the data lines of the first routing input set and at least two data lines of the second routing input set, and having select terminals coupled to the one or more control lines of the first routing input set and to a control line of the second routing input set; and
   a second multiplexer coupled to the second set of routing input lines, the first multiplexer being configurable to select among the data lines of the first routing input set in one configuration and among the data lines of the first and second routing input sets in another configuration.

10. The programmable logic device of claim 9, wherein the routing resource is a crosspoint switch.

11. The programmable logic device of claim 9, wherein the first multiplexer has input terminals coupled to all of the data lines of the second routing input set.

12. The programmable logic device of claim 9, including a third set of routing input lines and a third multiplexer coupled thereto, the second multiplexer having input terminals coupled to the data lines of the second routing input set and to at least two data lines of the third routing input set, and having select terminals coupled to the one or more control lines of the second routing input set and to a control line of the third routing input set, the second multiplexer being configurable to select among the data lines of the second routing input set in one configuration and among the data lines of the second and third routing input sets in another configuration.

13. The programmable logic device of claim 9, wherein a select terminal of the first multiplexer is coupled to a control line of the second routing input set through a logic gate, the logic gate operable to block control signals from coupling to the select terminal in one of the multiplexer configurations and to not block control signals from coupling to the select terminal in the remaining multiplexer configuration.

14. The programmable logic device of claim 9, wherein the first and second routing input sets are two of N routing input sets and the first and second multiplexers are two of N multiplexers, the Nth multiplexer having input terminals coupled to the data lines of the Nth routing input set and at least two data lines of the first routing input set, and having select terminals coupled to the one or more control lines of the Nth routing input set and to a control line of the first routing input set, the Nth multiplexer being configurable to select among the data lines of the Nth routing input set in one configuration and among the data lines of the Nth and first routing input sets in another configuration.

15. The programmable logic device of claim 9, wherein the routing resource is further configured to route signals from the set of input signals onto a fourth and a fifth set of input lines, the device further comprising:

a third multiplexer configured to select from the input signals carried on the third and fourth set of input lines to provide a third output signal; and a fourth multiplexer configured to select from the input signals carried on the fourth and fifth set of input lines to provide a fourth output signal, wherein the routing resource is configurable to route the third and fourth output signals into the set of input signals.

16. The programmable logic device of claim 15, wherein the first, second, third, and fourth set of input lines each comprises four input lines.

17. A method for implementing a 2M:1 multiplexer, comprising:

providing a first, second, third, and a fourth M:1 multiplexer, wherein the first and second M:1 multiplexers share a first set of N input signals, the second and third M:1 multiplexers share a second set of N input signals, and the third and fourth multiplexers share a third set of N input signals, and wherein N is less than M;

routing a set of M input signals to the first M:1 multiplexer;

selecting from the set of M input signals received at the first M:1 multiplexer to provide a first output signal;

routing a set of M input signals to the fourth M:1 multiplexer;

selecting from the set of M input signals received at the fourth M:1 multiplexer to provide a second output signal;

routing the first and second output signal into the second set of N input signals received at the third M:1 multiplexer; and selecting either the first or second output signal from the second set of N input signals received at the third multiplexer M:1 to provide an third output signal, whereby the third M:1 multiplexer implements a 2M:1 multiplexer.

18. The method of claim 17, wherein M equals 2N.

19. The method of claim 18, wherein M is 8 and N is 4.

* * * * *